(12) United States Patent
Kohyama

(10) Patent No.: US 7,605,042 B2
(45) Date of Patent: Oct. 20, 2009

(54) SOI BOTTOM PRE-DOPING MERGED E-SIGE FOR POLY HEIGHT REDUCTION

(75) Inventor: Yusuke Kohyama, Poughkeepsie, NY (US)

(73) Assignee: Toshiba America Electronic Components, Inc., Irvine, CA (US)

( * ) Notice: Subject to any disclaimer, the term of this patent is extended or adjusted under 35 U.S.C. 154(b) by 479 days.

(21) Appl. No.: 11/107,843

(22) Filed: Apr. 18, 2005

(65) Prior Publication Data

US 2006/0234432 A1 Oct. 19, 2006

(51) Int. Cl.
*H01L 21/336* (2006.01)
(52) U.S. Cl. .............................. 438/301; 257/E21.431
(58) Field of Classification Search ................ 438/301, 438/181; 257/E21.431
See application file for complete search history.

(56) References Cited

U.S. PATENT DOCUMENTS

| | | | | |
|---|---|---|---|---|
| 5,313,075 | A * | 5/1994 | Zhang et al. ................. | 257/57 |
| 5,663,570 | A * | 9/1997 | Reedy et al. ................. | 257/9 |
| 5,726,459 | A * | 3/1998 | Hsu et al. ................. | 257/55 |
| 5,869,359 | A * | 2/1999 | Prabhakar ................. | 438/149 |
| 6,051,509 | A * | 4/2000 | Tsuchiaki ................. | 438/758 |
| 6,303,450 | B1 * | 10/2001 | Park et al. ................. | 438/300 |
| 6,780,686 | B2 * | 8/2004 | Wei et al. ................. | 438/146 |
| 7,138,309 | B2 * | 11/2006 | Lee et al. ................. | 438/197 |

FOREIGN PATENT DOCUMENTS

| | | |
|---|---|---|
| TW | 506076 | 10/2002 |
| TW | 530385 | 5/2003 |
| TW | 546713 | 8/2003 |
| TW | 1225283 | 12/2004 |

OTHER PUBLICATIONS

K. Mistry, et al., "Delaying Forever: Uniaxial Strained Silicon Transistors in a 90nm CMOS Technology", 2004 Symposium on VLSI Technology, pp. 50-51.
P.R. Chidambaram, B., et al., "35% Drive Current Improvement from Recessed-SiGe Drain Extensions on 37 nm Gate Length PMOS", 2004 Symposium on VLSI Technology, Digest of Technical Papers, pp. 48-49.
T. Ghani, et al., "A 90nm High Volume Manufacturing Logic Technology Featuring Novel 45nm Gate Length Strained Silicon CMOS Transistors"., IEDM Tech., Dig., pp. 978-980, 2003.
Taiwanese Office Action for TW095111288 dated Feb. 22, 2008 and English Translation.

* cited by examiner

*Primary Examiner*—W. David Coleman
(74) *Attorney, Agent, or Firm*—Banner & Witcoff, Ltd.

(57) ABSTRACT

Semiconductor device structures, and methods for making such structures, are described that provide for fully-doped transistor source/drain regions while reducing or even avoiding boron penetration into the transistor channel, thereby improving the performance of the transistor. In addition, such a transistor may benefit from an SiGe layer that applies compressive stress to the transistor channel, thereby further improving the performance of the transistor.

9 Claims, 18 Drawing Sheets

US 7,605,042 B2

SOI BOTTOM PRE-DOPING MERGED E-SIGE FOR POLY HEIGHT REDUCTION

FIELD OF THE INVENTION

Aspects of the present invention are generally directed to semiconductor devices and their methods for manufacture, and more particularly to providing a way to dope the source/drain regions of a transistor while reducing boron penetration into the transistor channel, and also to providing a SiGe layer in the same transistor that applies compressive stress to the transistor channel.

BACKGROUND OF THE INVENTION

Various types of silicon transistors often include a polysilicon gate. There are many factors that can influence the proper height of the gate. For example, making the gate too tall can cause problems such as undesirable parasitic capacitance in the final product, as well as implant shadowing problems (especially where gates are repeated at a small scaled pitch) and difficulties in polysilicon etching during manufacturing. Thus, it is desirable to limit the height of the polysilicon gate.

On the other hand, making the gate too short can introduce other problems. For example, during transistor manufacture, there is a trade-off between either allowing for undesirable boron penetration into the transistor channel or insufficiently doping the source/drain regions of the transistor. For example, referring to FIG. 1, an illustrated conventional silicon device has a silicon-on-insulator (SOI) wafer configuration that includes a silicon body 1, a buried oxide (BOX) layer 4 immediately under silicon body 1, and a substrate (not shown) under BOX layer 4. The device has a transistor that includes a polysilicon gate 2 and a source/drain region 3. To create source/drain region 3, that region is doped with boron ions. Gate 2 is also simultaneously doped with boron ions. In FIG. 1, to avoid penetration of the boron ions into the channel below gate 2, a low energy dose of boron ion is used. While successfully avoiding channel boron penetration, the side effect of such a low energy dose is that source/drain region 3 is not fully doped such that it abuts BOX layer 4. In other words, there is a gap between the source/drain regions 3 and BOX layer 4. This can lead to an undesirably high junction capacitance.

Referring to FIG. 2, this time a higher energy dose of boron ions is used. As a result, source/drain region 3 is now properly abutted to BOX layer 4, thus reducing the junction capacitance. However, in order to fully dope source/drain region 3, a side effect is that boron ions have penetrated fully through gate 2 into the channel portion of silicon body 1 below. Such channel boron penetration results in extensive degradation of channel mobility, which is quite undesirable. Consequently, there is a need for a way to fully dope a transistor source/drain region without allowing an undesirable amount of boron ions to penetrate into the channel.

In addition, it has been found that the use of a silicon-germanium (SiGe) layer on opposing sides of the gate and channel of a transistor can greatly improve the performance of the transistor. This is caused by the compressive forces placed on the channel by the SiGe layer. It would therefore also be desirable to find a way to manufacture a transistor including such an SiGe layer, yet additionally fully dope the source/drain region without while minimizing or otherwise reducing channel boron penetration.

BRIEF SUMMARY OF THE INVENTION

Aspects of the present invention are directed to methods for manufacturing a semiconductor device, such as on a silicon-on-insulator (SOI) wafer, that has a transistor with source/drain regions that are sufficiently doped with boron ions while reducing or even avoiding boron penetration of the transistor channel. This may result in a transistor having superior operating characteristics such as a lower junction capacitance. Such a device may be provided without needing to manufacture excessively tall transistor gates, which may result in the transistor further having low parasitic capacitance, while utilizing a relatively simple and inexpensive set of manufacturing steps. In addition to achieving the above, the manufacturing process may further allow for the addition of a silicon germanium (SiGe) layer that provides compressive stress on the transistor channel, thereby improving hole mobility within the P-type transistor channel.

Further aspects of the present invention are directed to methods for manufacturing the above-mentioned semiconductor device such that the above-mentioned transistor is a p-type field-effect transistor (PFET), wherein the method further allow for simultaneous manufacture of an n-type field-effect transistor (NFET) on the same wafer.

Still further aspects of the present invention are directed to the semiconductor device and/or the transistor that result from the above-mentioned manufacturing methods.

These and other aspects of the invention will be apparent upon consideration of the following detailed description of illustrative embodiments.

BRIEF DESCRIPTION OF THE DRAWINGS

A more complete understanding of the present invention and the advantages thereof may be acquired by referring to the following description in consideration of the accompanying drawings, in which like reference numbers indicate like features.

DETAILED DESCRIPTION OF ILLUSTRATIVE EMBODIMENTS

Figure 1:
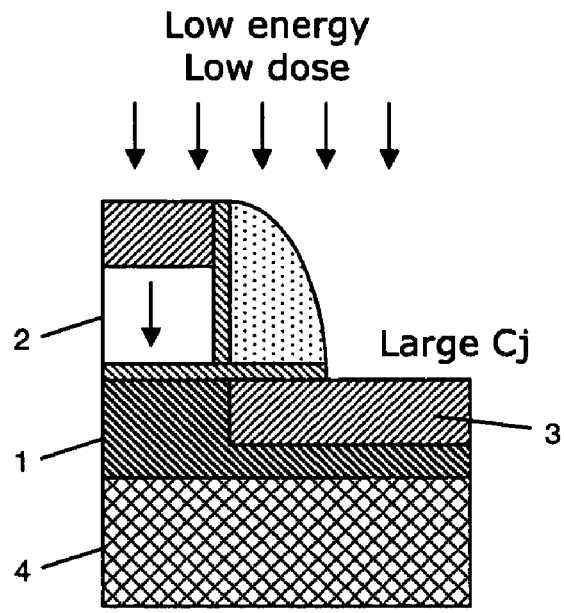
FIG. 1 shows conventional low-energy boron doping of an SOI device, resulting in low dosage doping.
Figure 2:
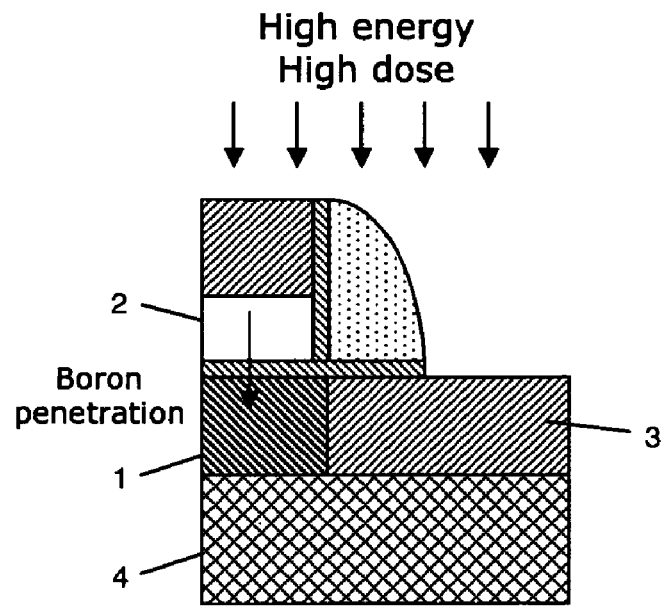
FIG. 2 shows conventional high-energy boron doping of an SOI device, resulting in high dosage doping.
Figure 3:
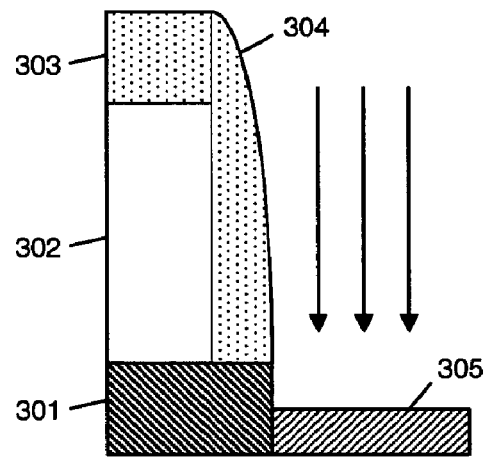
FIGS. 3-6 show illustrative main steps that may be performed in manufacturing an SOI device that has an epitaxial SiGe layer.
Figure 4:
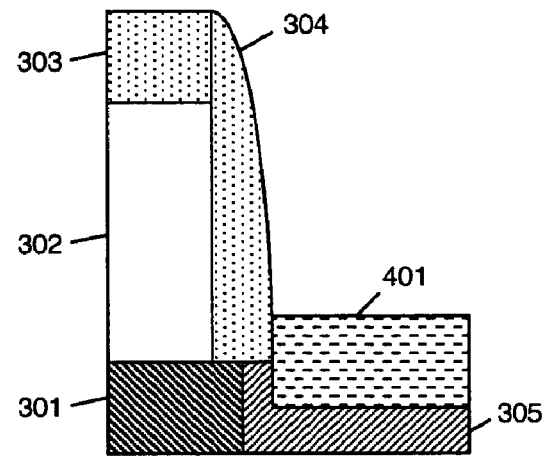
Figure 5:
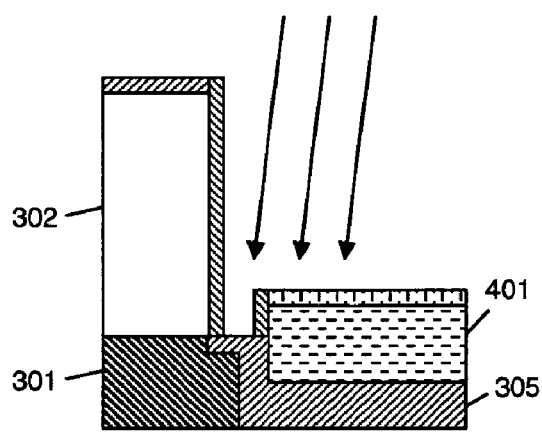
Figure 6:
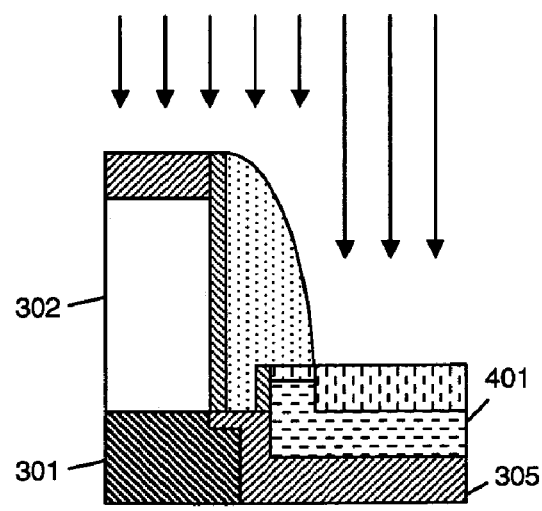

A summary highlighting certain steps in an illustrative manufacturing process will now be described in connection with FIGS. 3-6, which are presented in consecutive order as may be performed in the illustrative process. Referring to FIG. 3, a portion of a conventional SOI wafer is shown including a silicon body 301. A p-type field-effect transistor (PFET) polysilicon gate 302 is formed on silicon body 301, and sidewall spacers 304 are formed on the sidewalls of gate 302. Gate 302 is also capped with a SiN layer 303. A recessed portion 305 of silicon body 301 is pre-doped by boron implantation. Next, in FIG. 4, an SiGe layer 401 is epitaxially grown on recessed portion 305. After extension formation is performed in FIG. 5, then in FIG. 6 gate 302 and source/drain regions are implanted with low energy boron, thereby reducing or even avoiding boron penetration into the channel below gate 302. Such low energy boron may have an energy in the range of, for example, 2-10 KeV, such as about 5 KeV.

Figure 7:
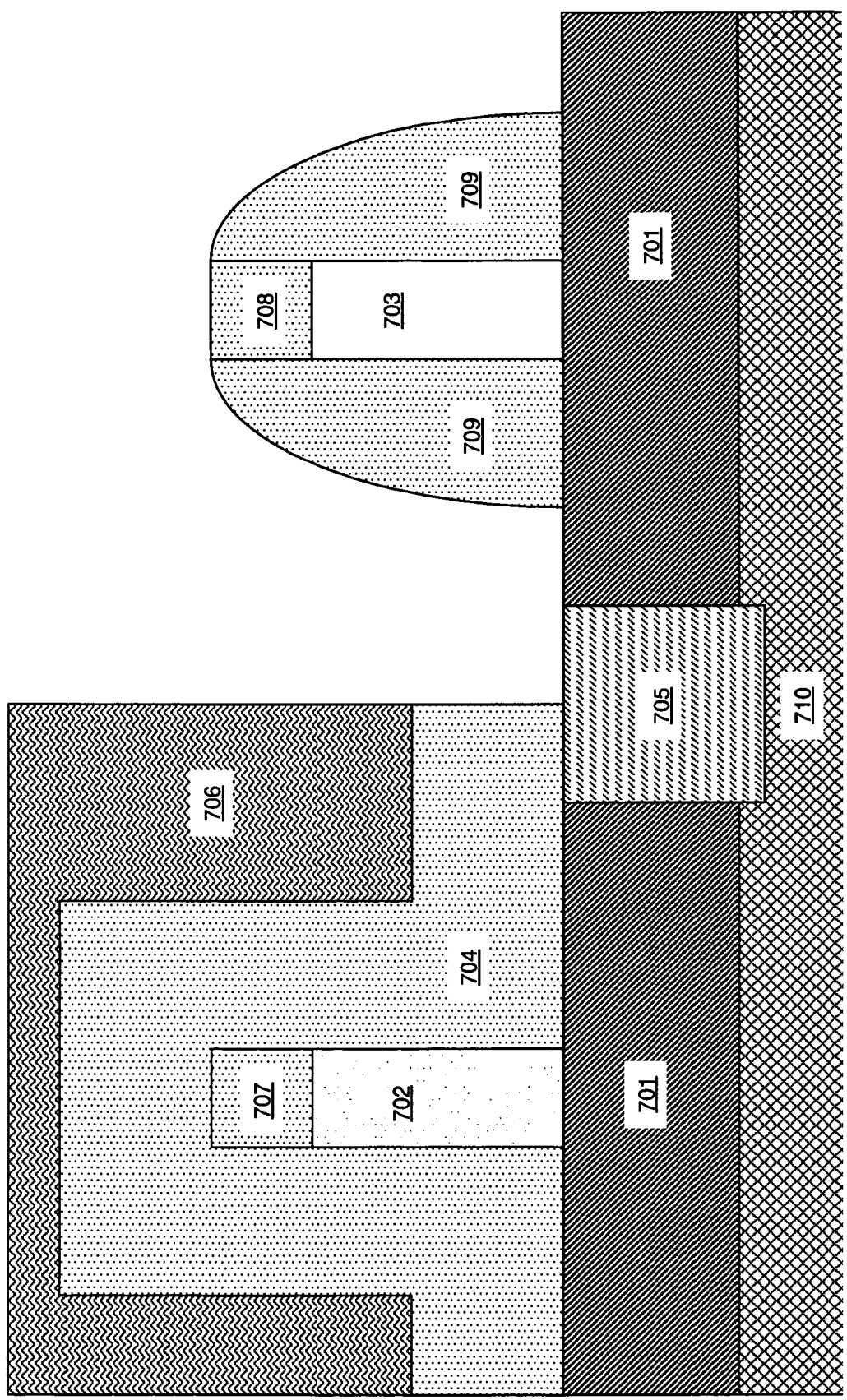
FIGS. 7-22 show illustrative steps that may be performed in manufacturing another SOI device that has an epitaxial SiGe layer.

A more detailed description of an illustrative manufacturing process will now be discussed in connection with FIGS. 7-22, which are presented in consecutive order as may be performed in the illustrative process. Referring first to FIG. 7, a portion of a conventional SOI wafer is shown including a silicon body 701 having an embedded shallow trench isolation (STI) layer 705. Silicon body 701 may be, e.g., approximately 50-70 nm thick, and STI layer 705 may be, e.g., approximately 60-80 nm thick. Silicon body 701 is disposed on a BOX layer 710, and STI layer 705 extends slightly into BOX layer 710. BOX layer 710 may be, e.g., approximately 150 nm thick. BOX layer 710 is, in turn, disposed on a substrate (not shown). An n-type field-effect transistor (NFET) gate 702 and a PFET gate 703 are formed in a conventional manner on silicon body 701 on opposing sides of STI layer 705. Gates 702, 703 may be, e.g., approximately 100 nm in height or less, and may be disposed on silicon body 701 with a thin gate oxide layer (not shown). A first SiN layer is then deposited on top of gates 702, 703 in a conventional manner, to form caps 707, 708. Caps 707, 708 may be, e.g., approximately 50 nm thick or less. The sidewalls of gates 702, 703 are re-oxidized in a conventional manner (resulting in an approximately 5 nm wide re-oxidation layer, not shown, on the sidewalls of gates 702, 703), and a mask layer 704 (such as a second SiN layer) is deposited on the entire surface of the silicon wafer. Mask layer 704 may be, e.g., approximately 40 nm thick. Next, the SOI wafer is covered by a photo resist layer 706, which is exposed and etched so as to cover only the NFET area. Next, conventional reactive-ion etching (RIE) is performed using patterned photo resist layer 706 as a mask, resulting in sidewall spacers 709 on the sidewalls of PFET gate 703. Sidewall spacers 709 may each be, e.g., approximately 40 nm in width.

Figure 8:
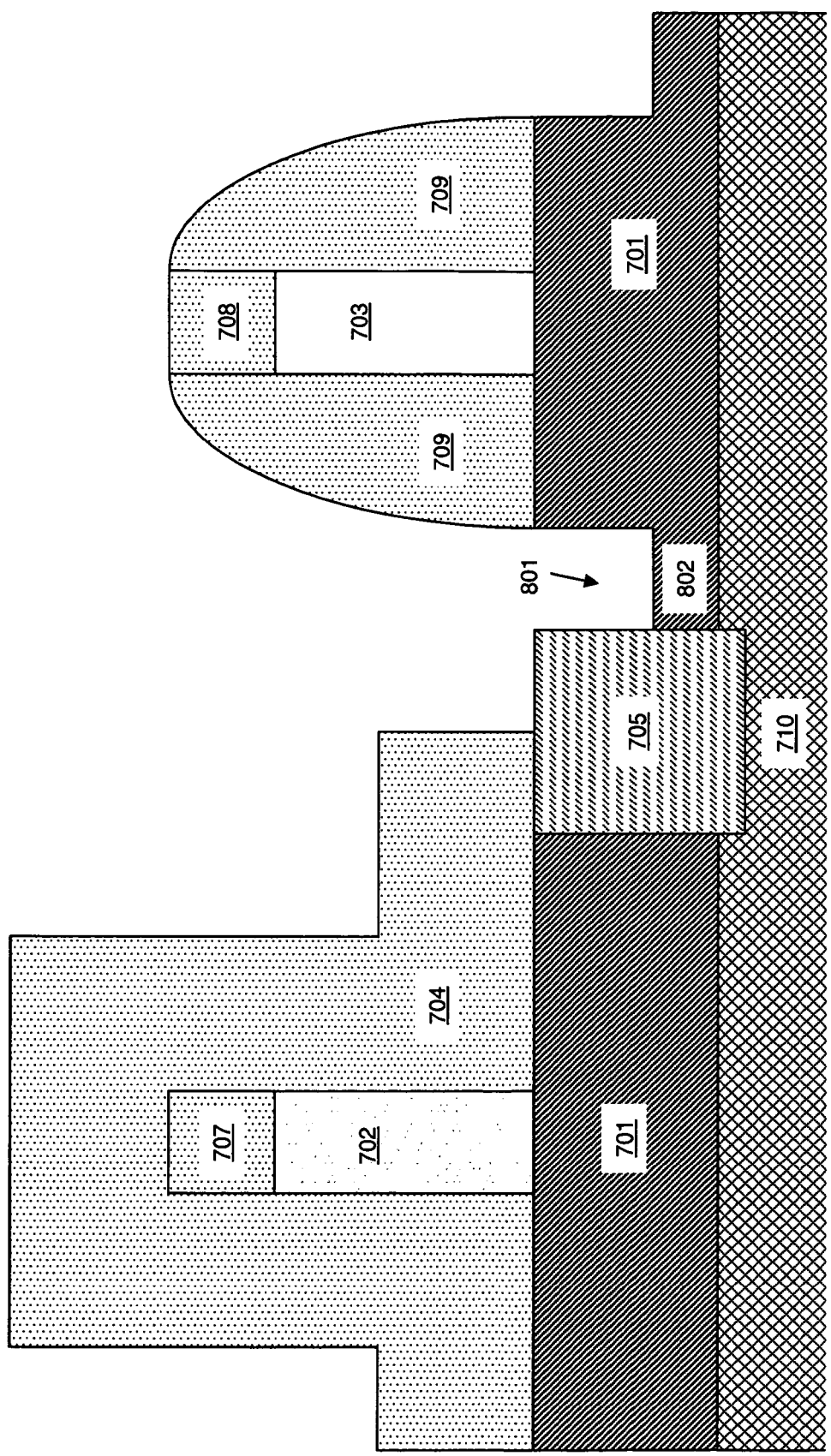

Referring to FIG. 8, photo resist layer 706 is removed. Next, the exposed portions of silicon body 701 are selectively recessed by conventional RIE using mask layer 704 and cap 708 as a mask, to result in recessed portions 802 each having a recess 801. Recesses 801 may be, e.g., approximately 40-60 nm in deep into silicon body 701, such that the remaining recessed portions 802 are, e.g., approximately 10 nm in thickness.

Figure 9:
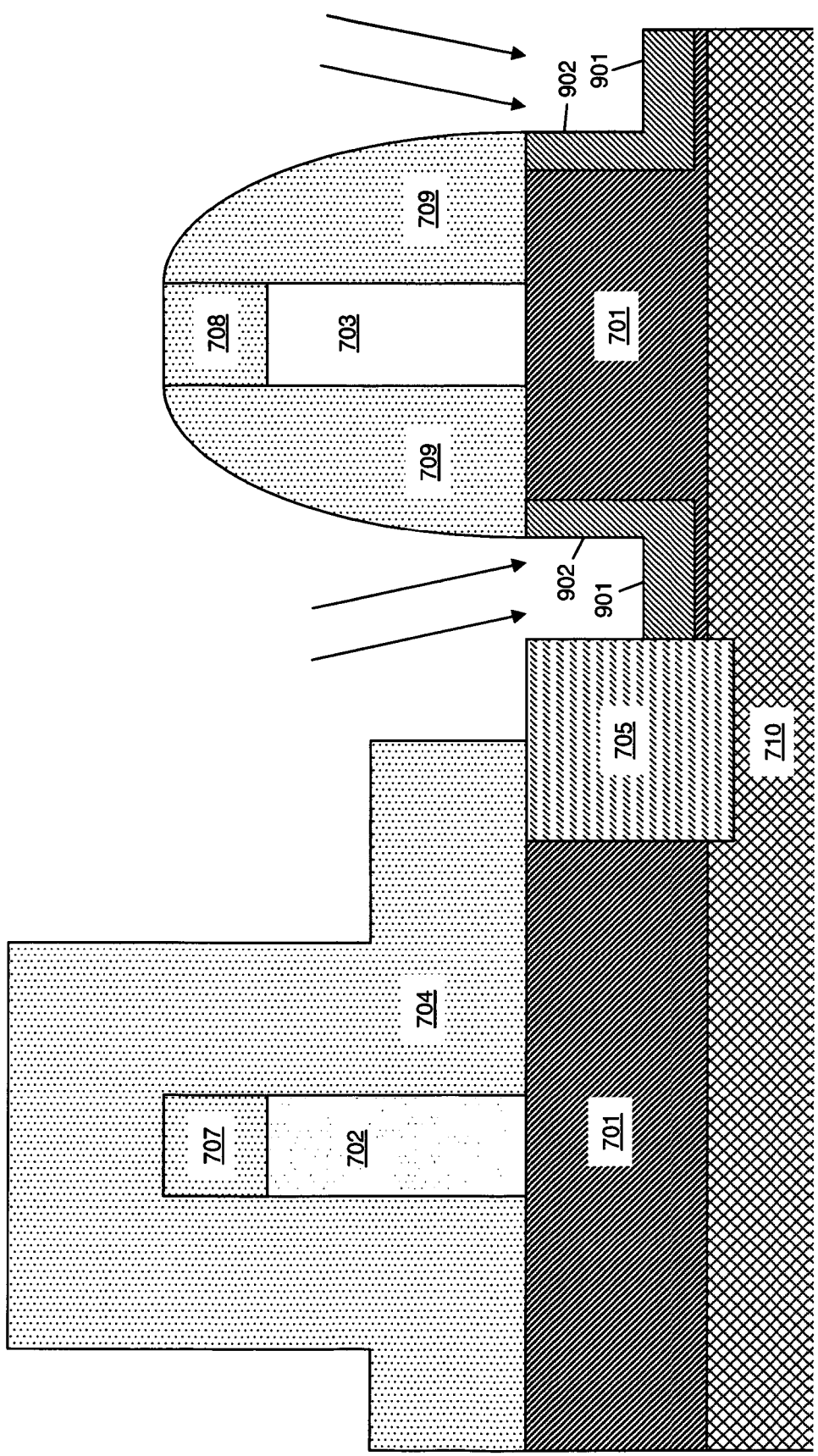

Referring to FIG. 9, boron is next implanted into the lower surface 901 and sidewalls 902 of recessed regions 801 in silicon body 701, resulting in a boron doped P-type region under surfaces 901 and 902. For example, boron difluoride (BF2) implantation at approximately 3 KeV, $1 \times 10^{15}$ cm$^{-2}$, at an angle of approximately 15 degrees from normal, may be used. This boron "pre-doping" allows a lower energy dose of boron to be used in the later doping step illustrated in FIG. 20.

Figure 10:
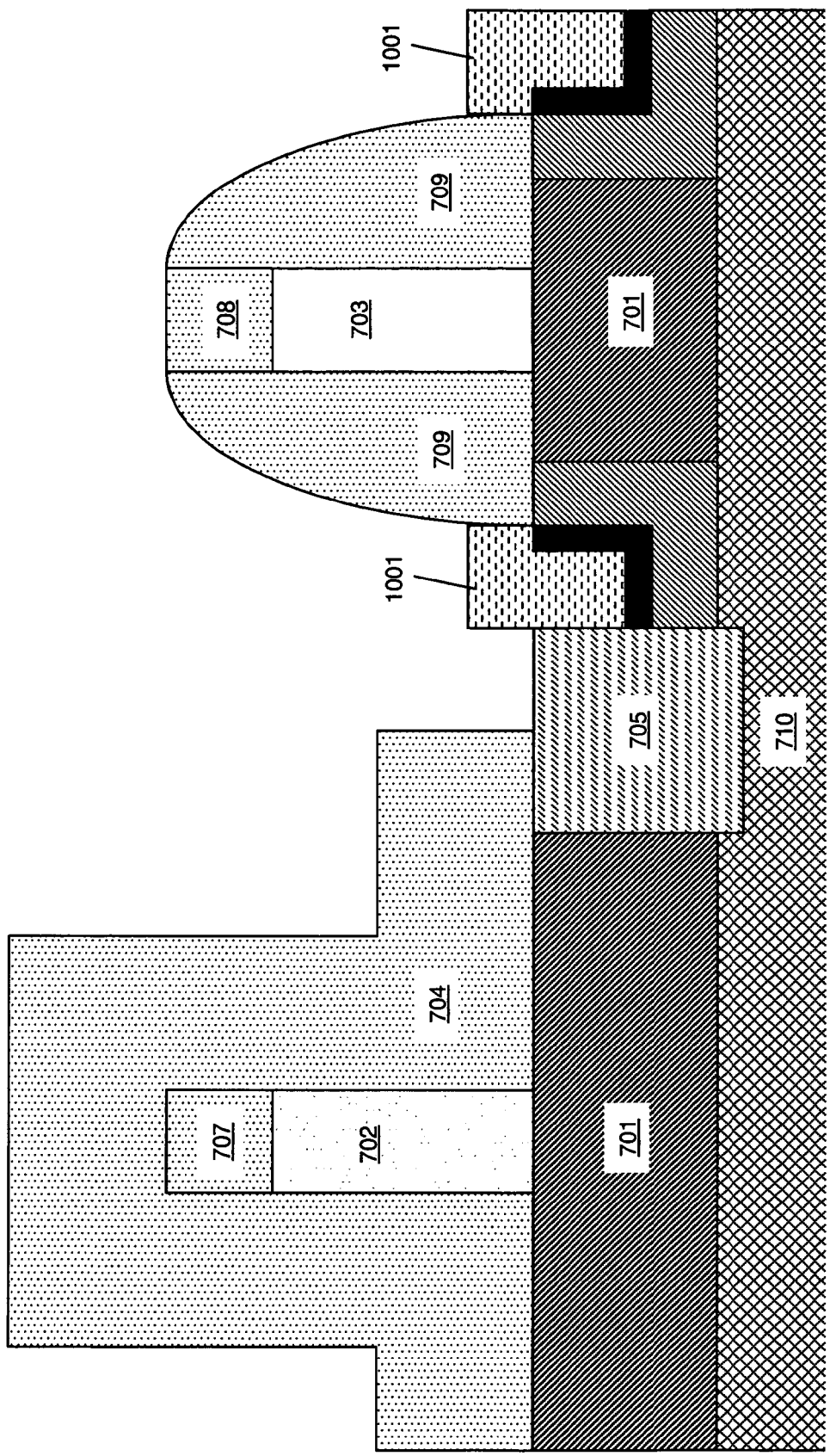

Referring to FIG. 10, an SiGe layer 1001 is then epitaxially grown on recessed regions 801. SiGe layer 1001 may be, e.g., approximately 50-70 nm thick. In addition, during or after such epitaxial growth, at least some of the boron in the boron doped P-type region under surfaces 901 and 902 diffuses into SiGe layer 1001, indicated in FIG. 10 by the darker portions of SiGe layer 1001. In addition, at least some of the boron under surface 901 diffuses into silicon body 701 such that the boron abuts BOX layer 710. Still more boron near surface 902 diffuses slightly toward the channel, as also shown in FIG. 10. SiGe layer 1001 provides compressive stress to the PFET channel below gate 703, thereby increasing the performance of the PFET.

Figure 11:
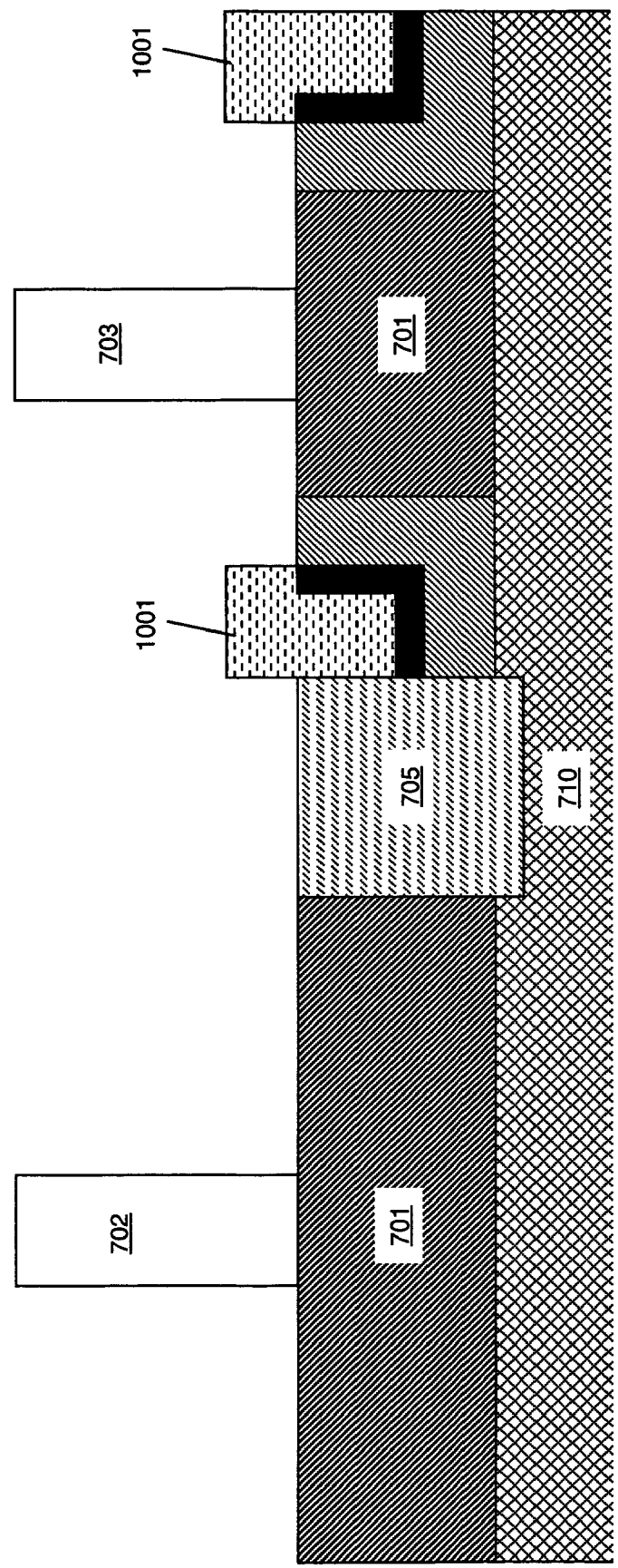

Referring to FIG. 11, mask layer 704 and caps 707, 708 are then removed.

Figure 12:
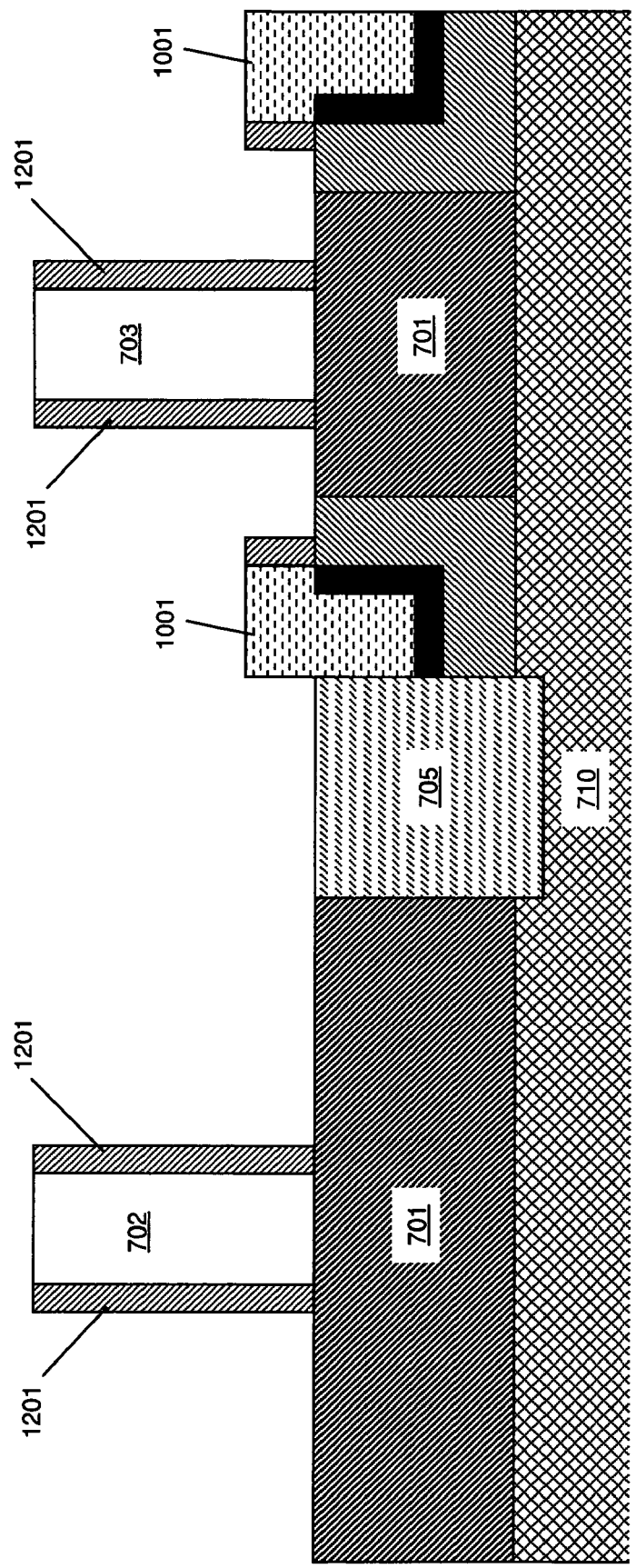

Referring to FIG. 12, offset spacers (such as a first oxide layer) 1201 are then formed on the sidewalls of gates 702, 703. Offset spacers 1201 may each extend the length of a respective one of gates 702, 703, and may each be, e.g., approximately 10 nm in width.

Figure 13:
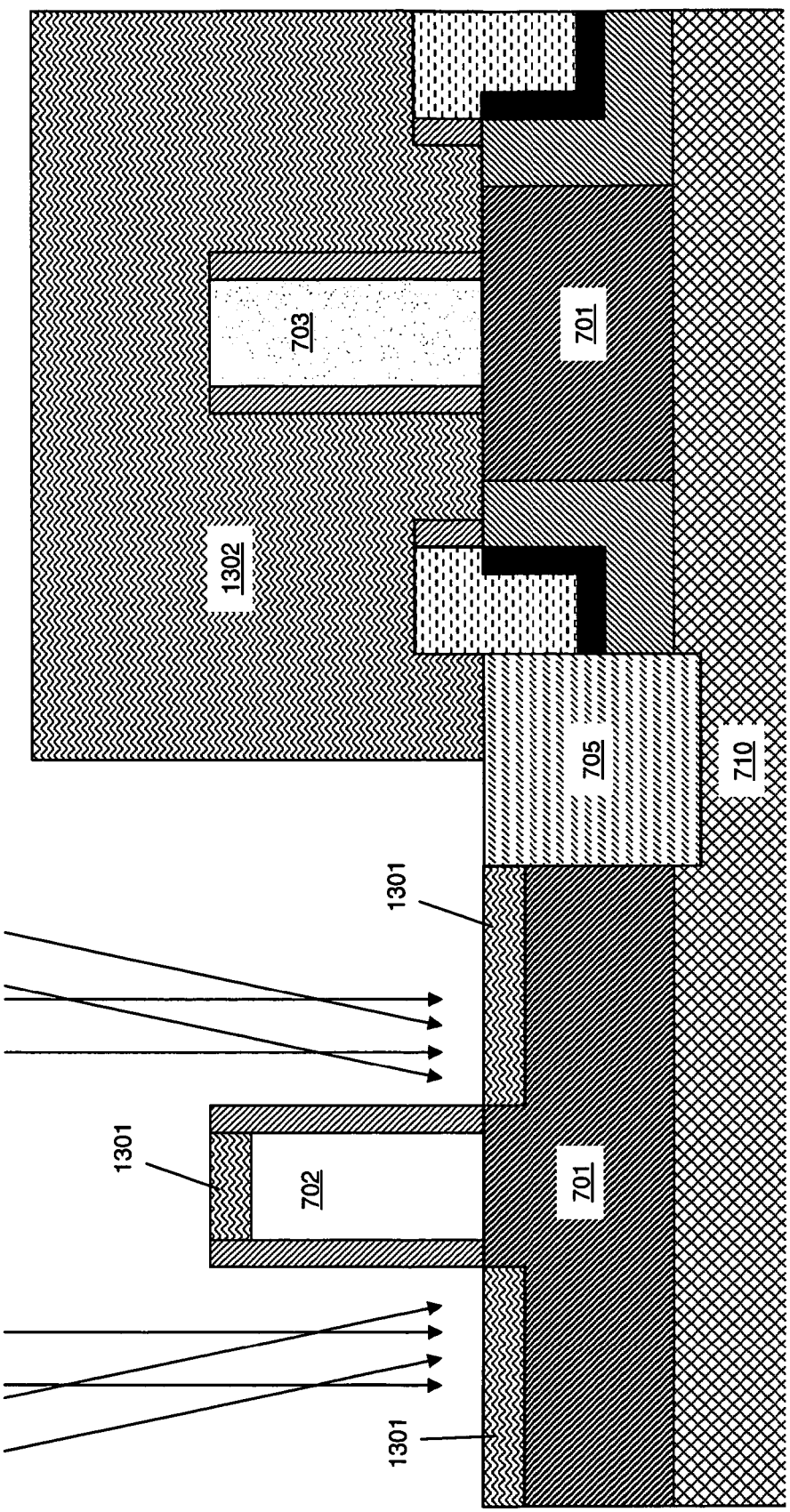
Figure 14:
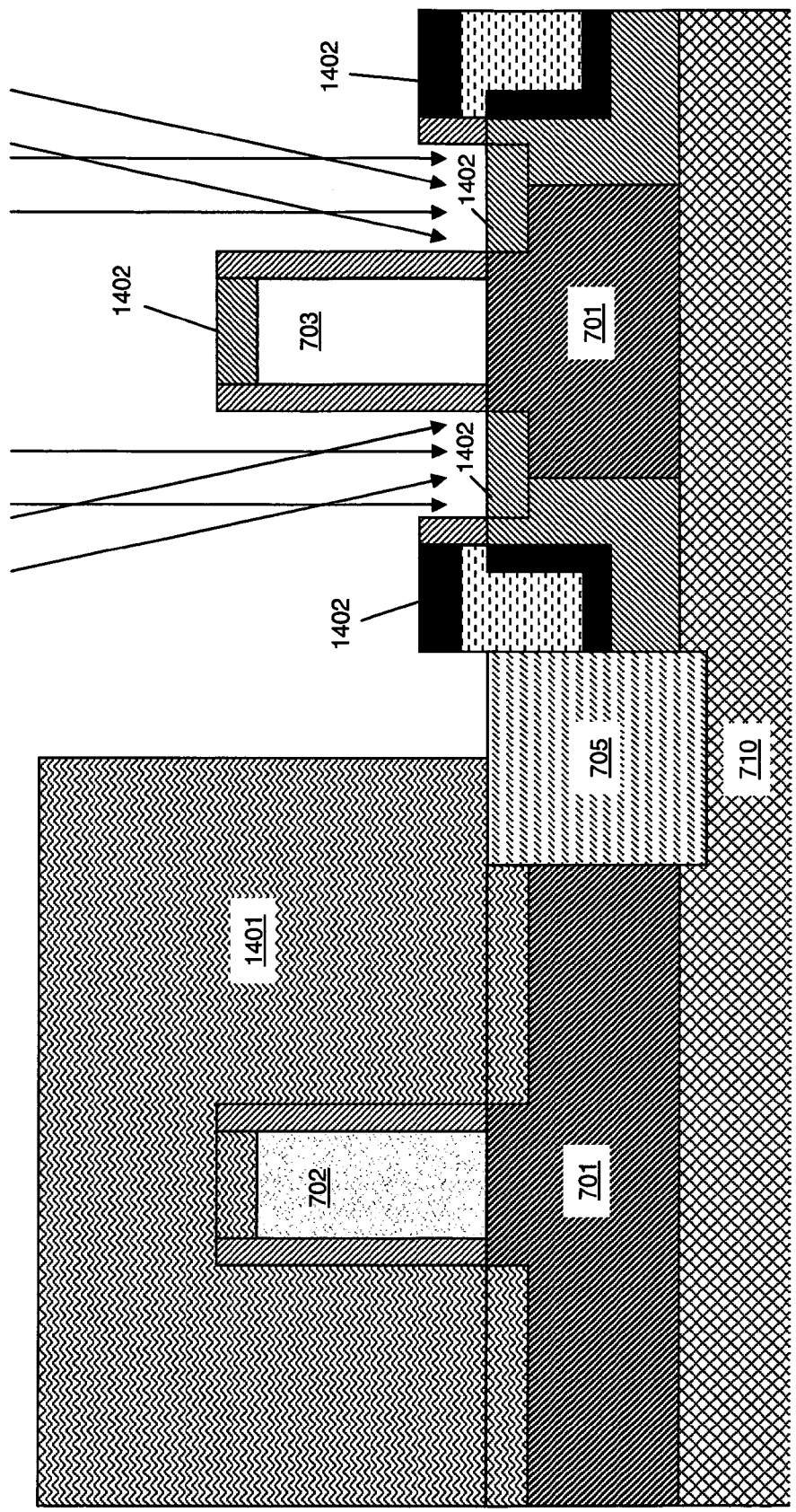

Referring to FIGS. 13 and 14, N-type extension and P-type halo implantation are then selectively performed on the NFET in areas 1301 and on the PFET (in areas 1402), respectively, using photo resist mask layers 1302 and 1401. In general, the extension implantation may be at a higher dose than the halo implantation. For example, in the NFET area, arsenic (As) extension implantation at approximately 2 KeV, $2 \times 10^{15}$ cm$^{-2}$, may be used, and boron (B) halo implantation at approximately 10 KeV, $8 \times 10^{13}$ cm$^{-2}$, at an angle of approximately 30 degrees from normal, may be used. Also, in the PFET area, boron difluoride (BF2) extension implantation at, for instance, approximately 3 KeV, $1 \times 10^{15}$ cm$^{-2}$, may be used, and arsenic (As) halo implantation at approximately 60 KeV, $5 \times 10^{13}$ cm$^{-2}$, at an angle of approximately 30 degrees from normal, may be used. Photo resist mask layers 1302, 1401 are subsequently each removed.

Figure 15:
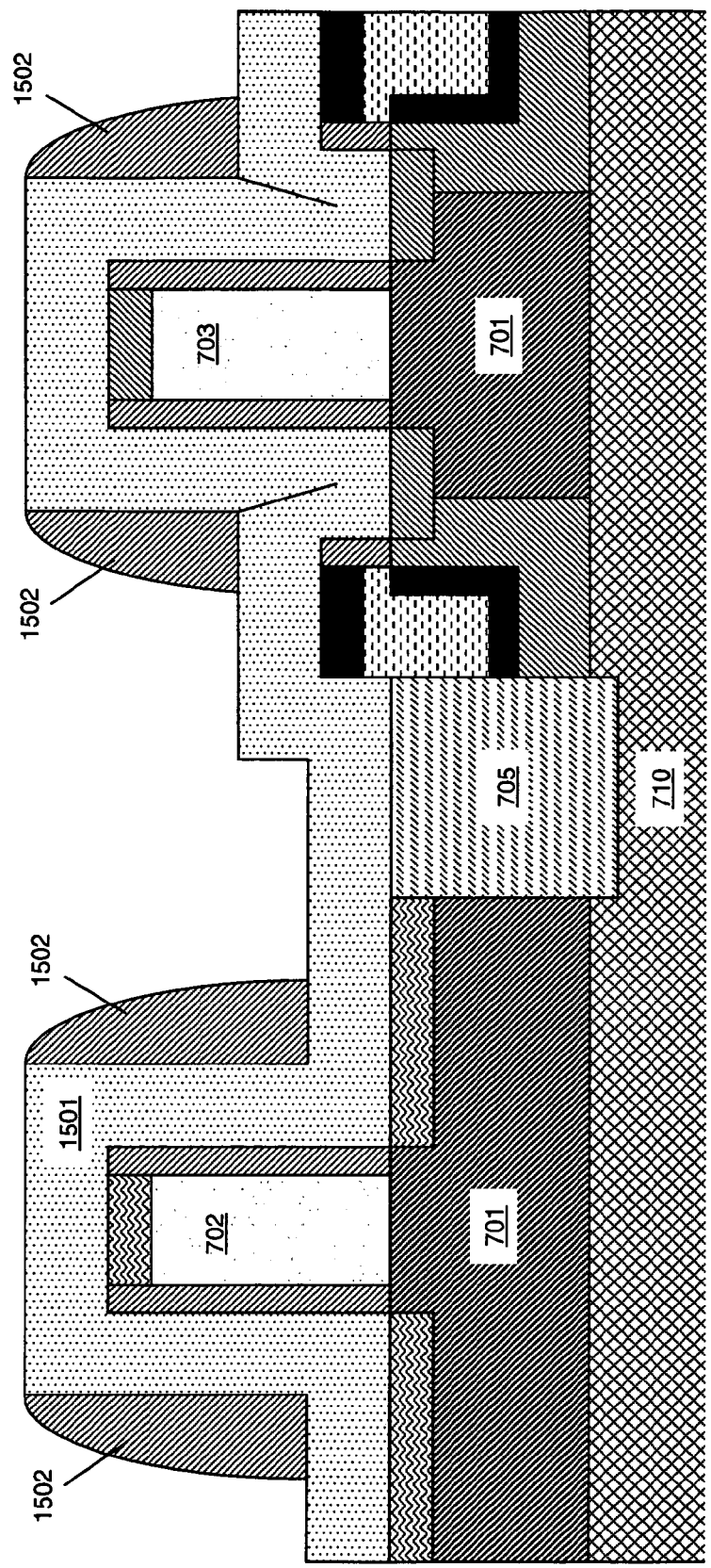

Referring to FIG. 15, a third SiN layer 1501 is then deposited on the wafer. Third SiN layer 1501 may be, e.g., approximately 50 nm thick. Next, another set of offset spacers (such as a second oxide layer) 1502 are formed on third SiN layer 1501 using a conventional blanket RIE technique. These offset spacers 1502 may each be, e.g., approximately 40 nm in width.

Figure 16:
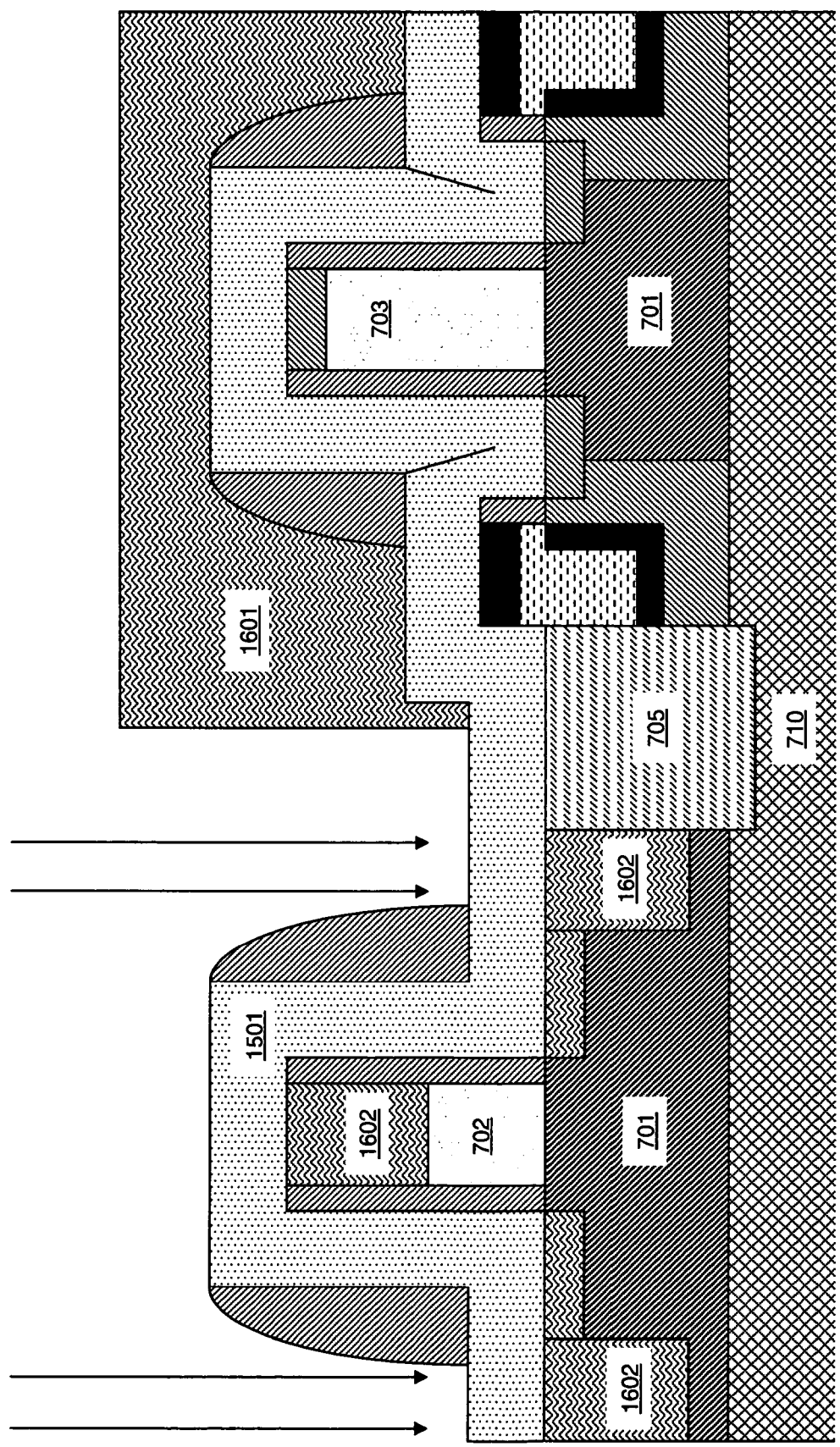

Referring to FIG. 16, deep source/drain implantation is then performed on only the NFET using a photo resist mask layer 1601. For example, phosphorus (P) implantation at 45 KeV, $1 \times 10^{15}$ cm$^{-2}$, may be used. As can be seen, areas 1602 are formed due to penetration of the high energy phosphorus through third SiN layer 1501.

Figure 17:
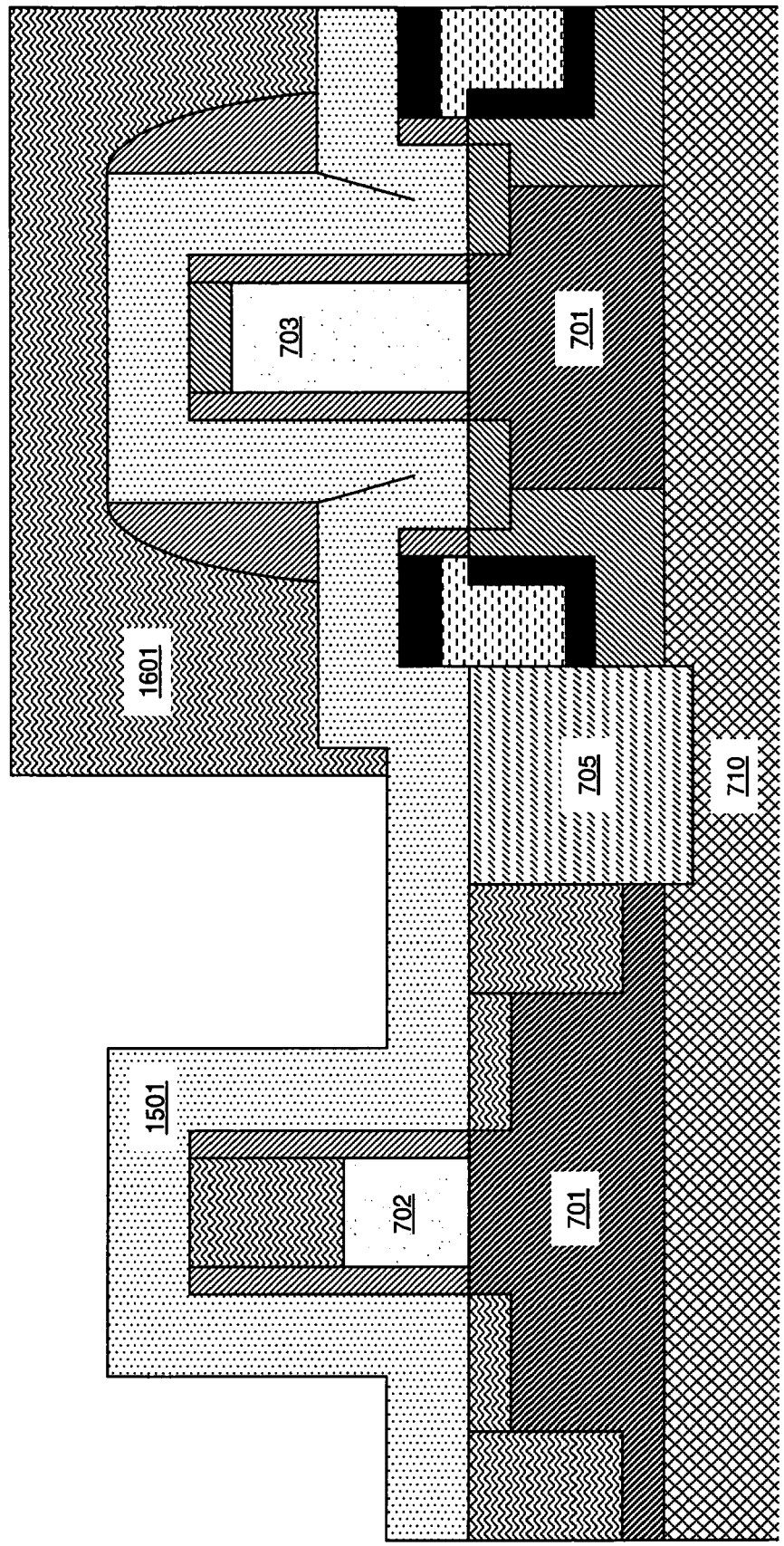

Referring to FIG. 17, offset spacers 1502 are then removed from the NFET (but not the PFET).

Figure 18:
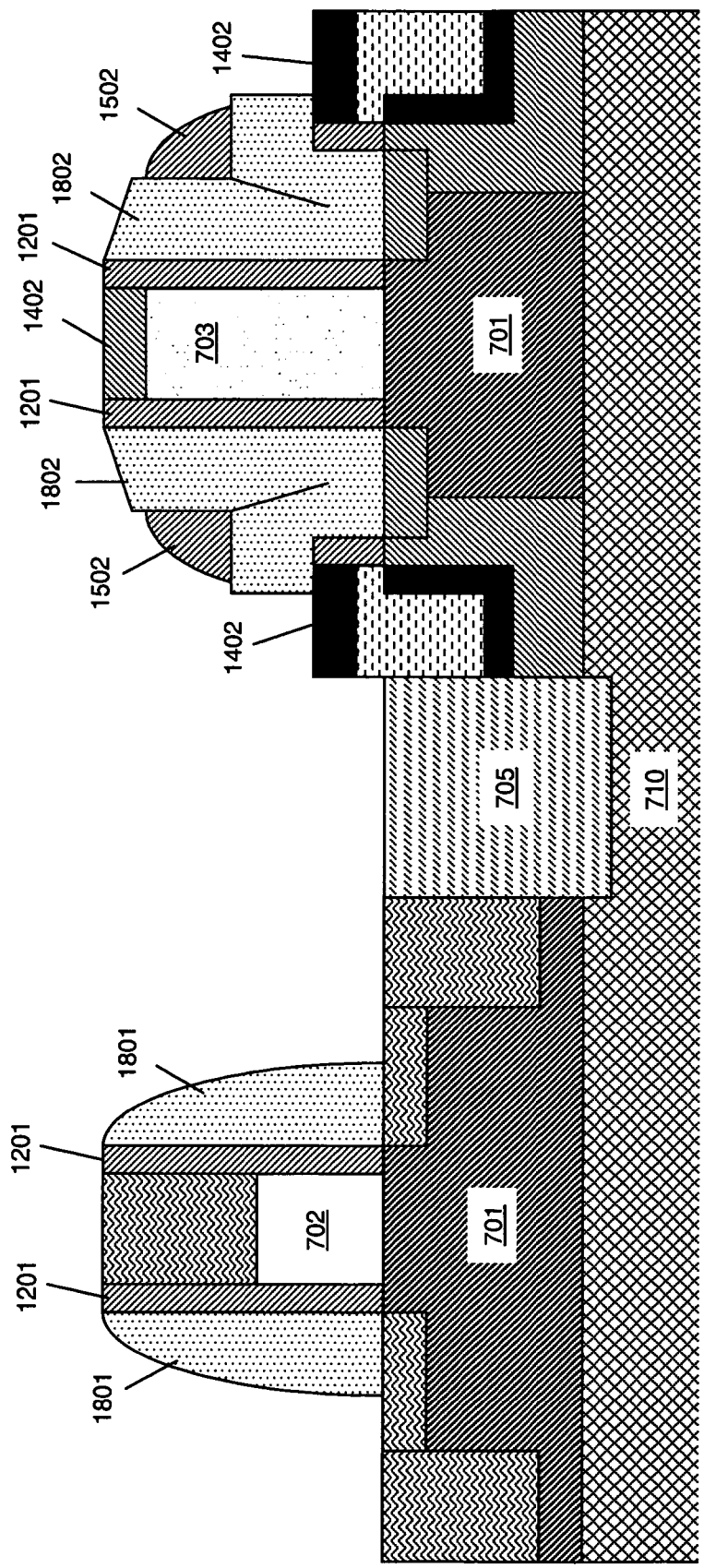

Referring to FIG. 18, narrow spacers 1801 are formed on opposing sides of NFET gate 702, and stacked wide spacers 1802 are formed on opposing sides of PFET gate 703 by performing conventional blanket RIE on third SiN layer 1501. Narrow spacers 1801 may be, e.g., approximately 40 nm in width, and wide spacers 1802 may be, e.g., approximately 90 nm in width.

Figure 19:
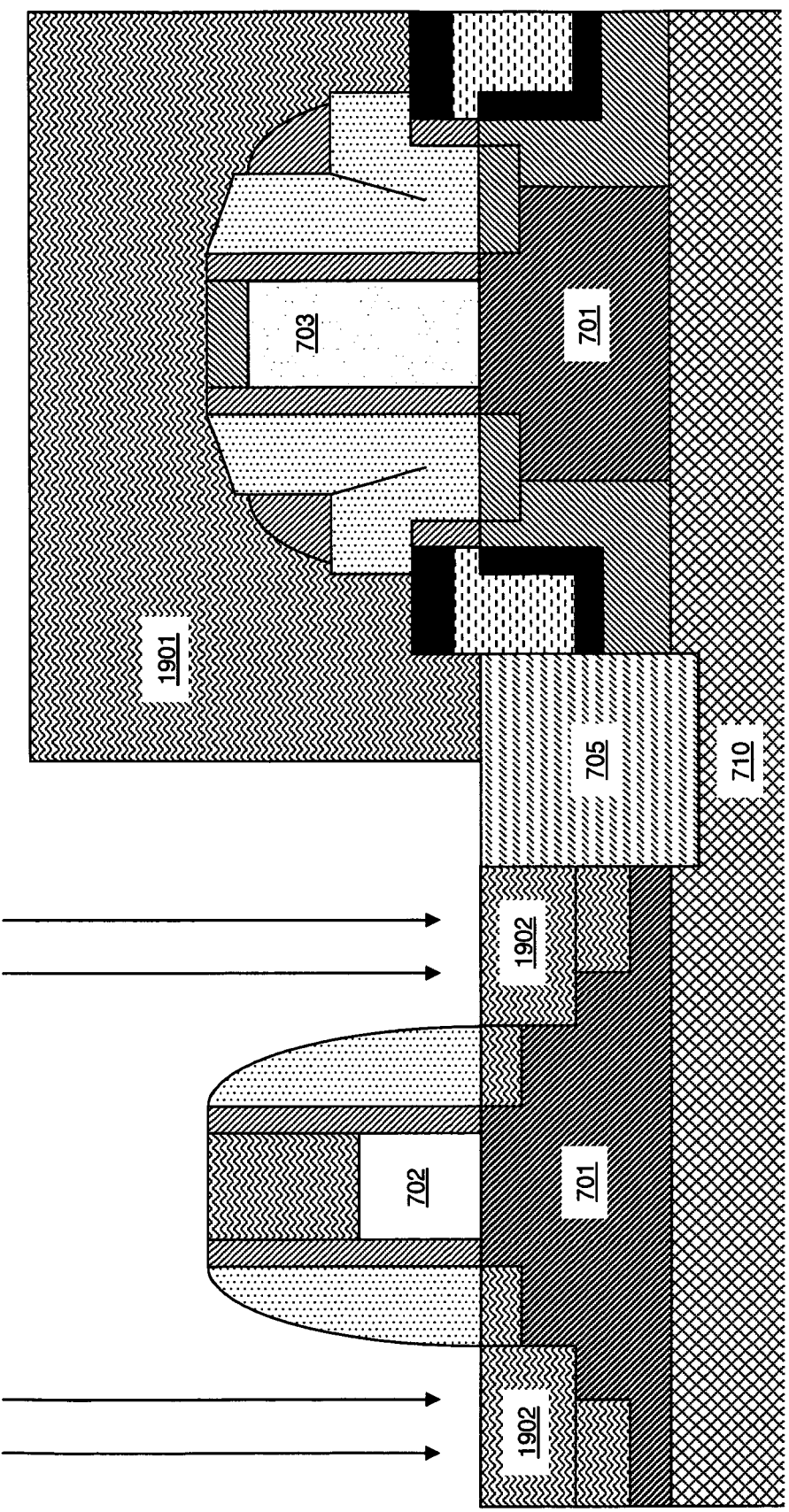
Figure 20:
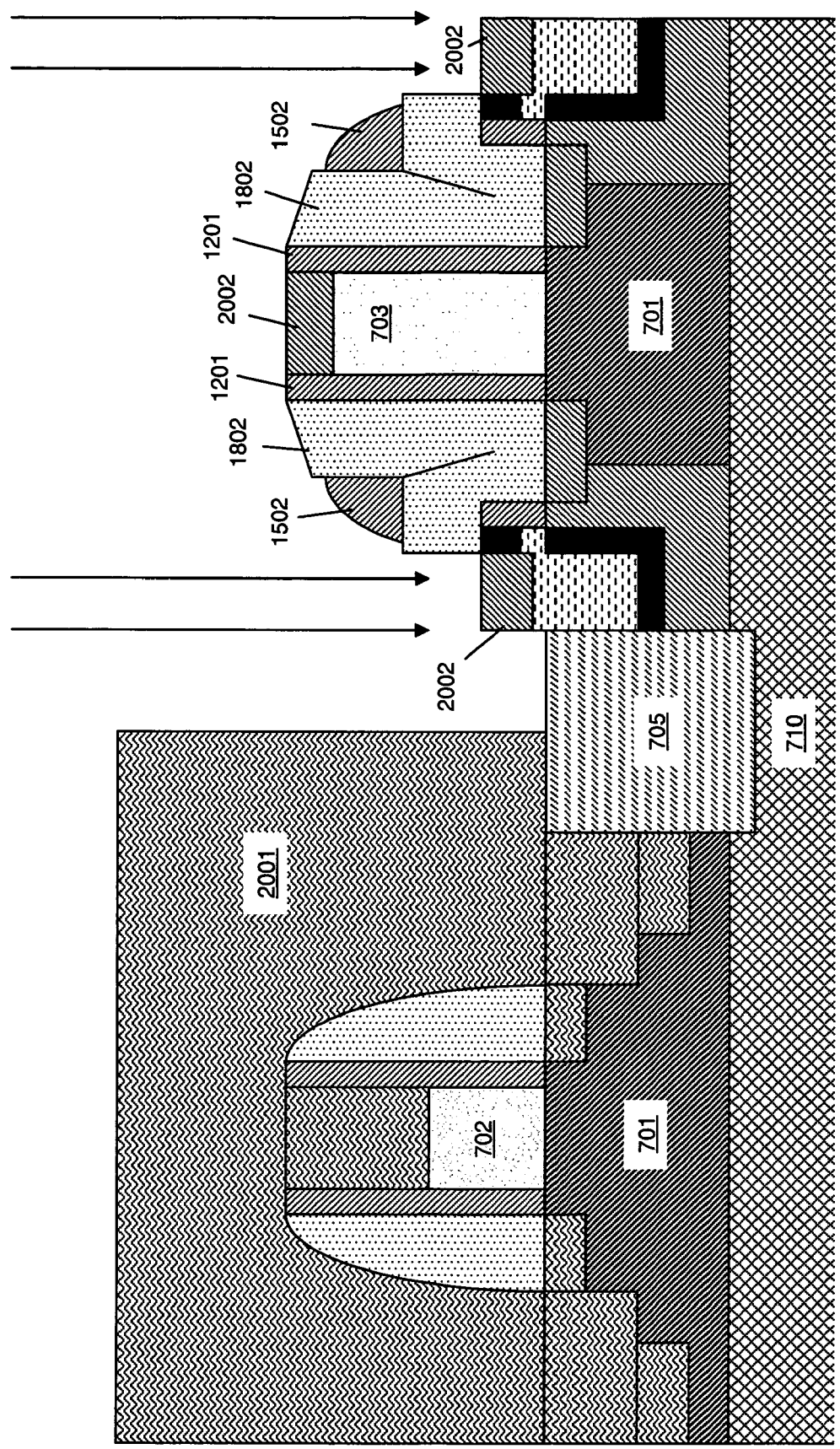

Referring to FIGS. 19 and 20, source/drain doping is performed on the NFET and the PFET, using photo resist mask layers 1901 and 2001, respectively. P-type doping of the PFET is performed using shallow, or light, implantation (which results in little or no boron penetration into gate 703). This is feasible due to the pre-doping of the source/drain regions of the PFET that already occurred in connection with FIG. 9. For example, in the NFET area, arsenic (As) implantation at approximately 15 KeV, $2 \times 10^{15}$ cm$^{-2}$, may be used, and in the PFET area, boron difluoride (BF2) implantation at approximately 5 KeV, $2.5 \times 10^{15}$ cm$^{-2}$, may be used. Photo resist layers 1901, 2001 are then removed after each respective implantation. As a result of heavy N-type doping, regions 1902 are formed as shown in FIG. 19. Also, as a result of shallow P-type doping, regions 2002 are formed as shown in FIG. 20. By performing these steps, boron penetration into the channel below PFET gate 703 that may otherwise later occur is thereby significantly reduced or even avoided altogether.

Figure 21:
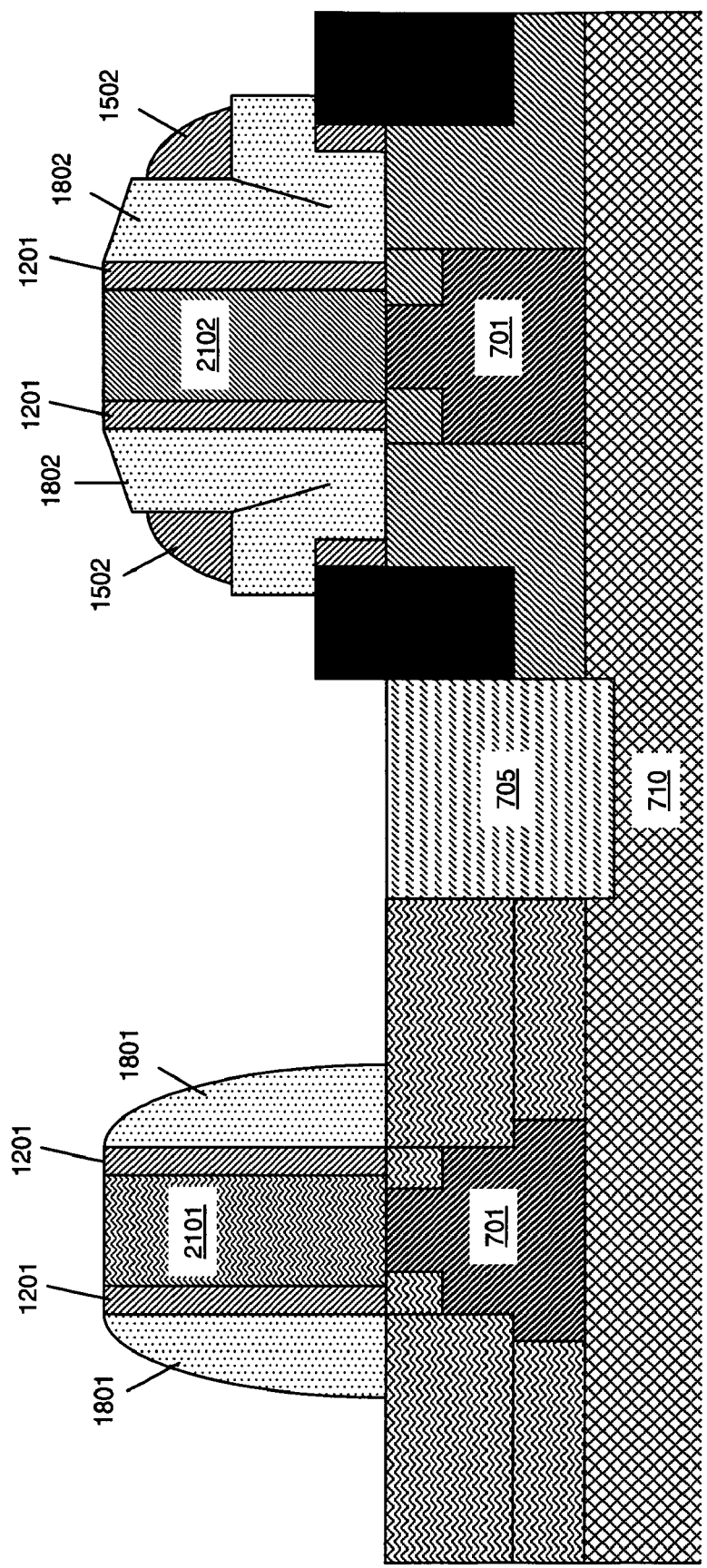

Referring to FIG. 21, activation annealing is performed, such that gates 703 and 704 become well-doped, resulting in well-doped gates 2101 and 2102, respectively, as well as the NFET and PFET source/drain regions such that these regions grow downward to abut the BOX layer 710 immediately under silicon body 701.

Figure 22:
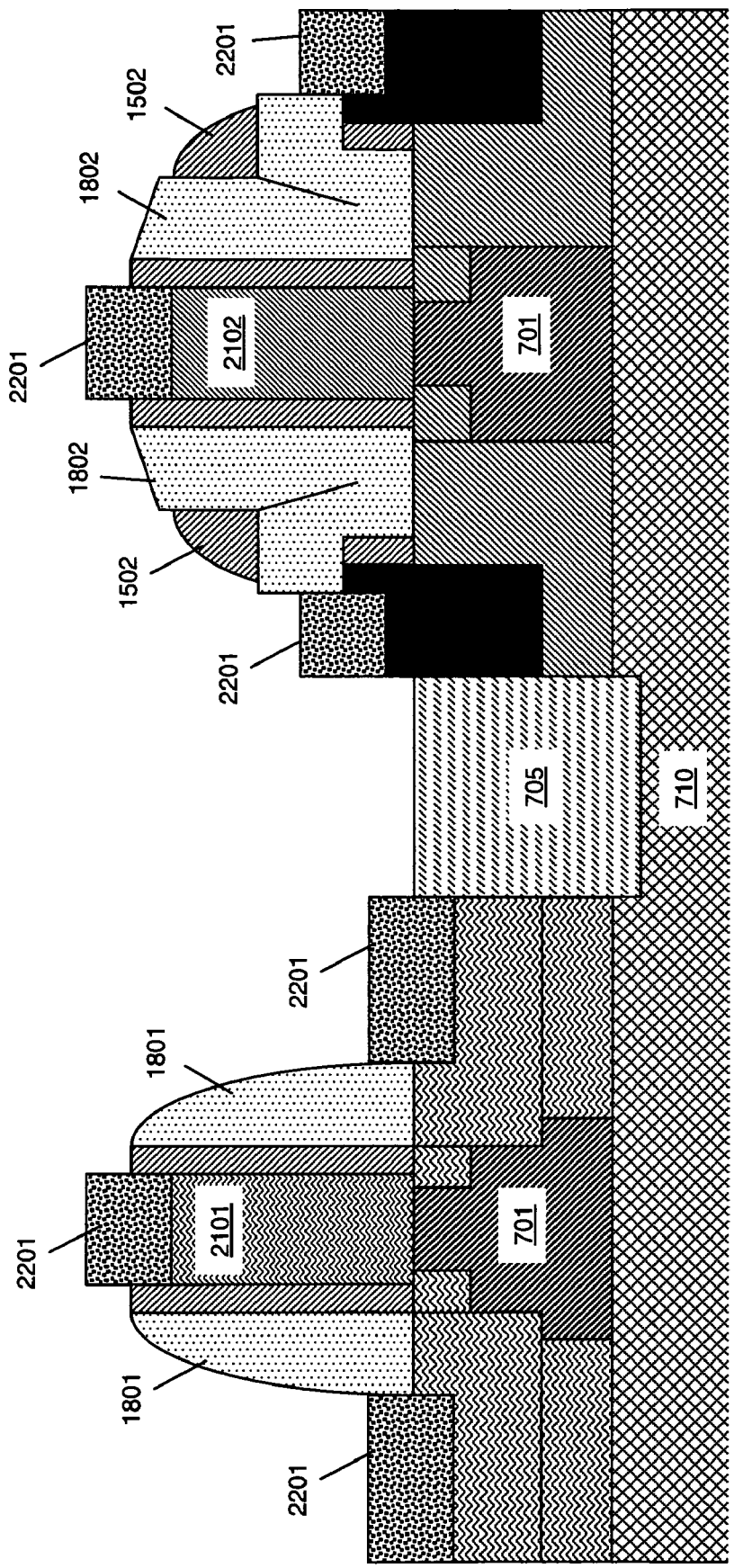

Referring to FIG. 22, a nickel silicide layer 2201 is formed on gates 2101, 2102 as well as the source/drain regions of the NFET and the PFET.

Thus, new structures, and methods for making such structures, have been described that provide for fully-doped transistor source/drain regions while reducing or even avoiding boron penetration into the transistor channel, thereby improving the performance of the transistor. In addition, such a transistor may benefit from an SiGe layer that applies compressive stress to the transistor channel, thereby further improving the performance of the transistor.

What is claimed is:

1. A method for forming a semiconductor device, comprising:
    forming a transistor gate on a silicon body;
    forming recessed portions of the silicon body on opposing sides of the gate;
    performing first doping of the recessed portions;
    forming an SiGe layer on the recessed portions after the step of performing first doping; and
    performing second doping of the gate after the SiGe layer is formed.

2. The method of claim 1, wherein the step of performing first doping includes BF2 implantation on the recessed portions at approximately 3 KeV, $1 \times 10^{15}$ cm$^{-2}$.

3. The method of claim 2, wherein the step of performing second doping includes BF2 implantation at approximately 5 KeV, $2.5 \times 10^{15}$ cm$^{-2}$.

4. The method of claim 1, wherein the step of performing first doping includes doping both a lower surface and a sidewall of each of the recessed portions.

5. The method of claim 1, further including:
    forming a sidewall spacer on each of the opposing sides of the gate; and
    removing each of the sidewall spacers; and
    performing extension formation,
        wherein the steps of performing first doping and forming the recessed portions are performed before the sidewall spacers are removed.

6. The method of claim 1, wherein a transistor channel region in the silicon body below the gate is not penetrated by boron in both the steps of performing first doping and second doping.

7. The method of claim 6, wherein the transistor gate comprises polysilicon and extends no more than about 100 nm above the silicon body.

8. The method of claim 6, wherein the step of performing second doping includes performing second doping of the gate.

9. The method of claim 1, wherein the silicon body is disposed above a buried oxide layer, and wherein step of performing first doping results in a pair of source/drain regions in the silicon body that each abuts the buried oxide layer.

* * * * *

UNITED STATES PATENT AND TRADEMARK OFFICE
CERTIFICATE OF CORRECTION

PATENT NO.      : 7,605,042 B2
APPLICATION NO. : 11/107843
DATED           : October 20, 2009
INVENTOR(S)     : Yusuke Kohyama It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 813 days.

Signed and Sealed this

Fifth Day of October, 2010

David J. Kappos
*Director of the United States Patent and Trademark Office*